United States Patent
Lee et al.

(10) Patent No.: US 8,502,249 B2
(45) Date of Patent: Aug. 6, 2013

(54) SEMICONDUCTOR LIGHT-EMITTING DEVICE HAVING GROOVE IN P-TYPE SEMICONDUCTOR LAYER AND METHOD FOR MANUFACTURING THE SAME

(75) Inventors: Ung Lee, Ulsan (KR); Yoon Seok Park, Gyeonggi-do (KR); Won Keun Cho, Gyeonggi-do (KR); So Young Jang, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 148 days.

(21) Appl. No.: 12/949,245

(22) Filed: Nov. 18, 2010

(65) Prior Publication Data

US 2011/0114980 A1   May 19, 2011

(30) Foreign Application Priority Data

Nov. 19, 2009   (KR) .................. 10-2009-0111996

(51) Int. Cl.
*H01L 33/00*   (2010.01)
*H01L 29/06*   (2006.01)
*H01L 21/00*   (2006.01)
*F21V 7/04*   (2006.01)

(52) U.S. Cl.
USPC   257/98; 257/622; 257/E33.001; 257/E33.072; 438/29; 438/42; 438/43; 362/615

(58) Field of Classification Search
None
See application file for complete search history.

(56) References Cited

U.S. PATENT DOCUMENTS

| | | |
|---|---|---|
| 2005/0285136 A1 | 12/2005 | Ou et al. |
| 2006/0076565 A1 | 4/2006 | Murofushi et al. |
| 2006/0267034 A1* | 11/2006 | Orita ............................... 257/95 |
| 2006/0278888 A1 | 12/2006 | Kim et al. |
| 2007/0108459 A1* | 5/2007 | Lu ................... 257/98 |
| 2008/0054278 A9* | 3/2008 | Ou et al. .......... 257/95 |
| 2009/0078951 A1* | 3/2009 | Miki et al. ....... 257/98 |
| 2010/0052000 A1* | 3/2010 | Ko et al. ........ 257/98 |
| 2010/0216270 A1* | 8/2010 | Liu et al. ......... 438/47 |

FOREIGN PATENT DOCUMENTS

CN   1755960 A   4/2006

OTHER PUBLICATIONS

Office Action dated Sep. 13, 2012 from The State Intellectual Property Office of the People's Republic of China in a counterpart Chinese application.

* cited by examiner

*Primary Examiner* — Michael Jung
(74) *Attorney, Agent, or Firm* — Morgan, Lewis & Bockius LLP

(57) ABSTRACT

A semiconductor light-emitting device capable of improving current distribution, and a method for manufacturing the same is disclosed, wherein the semiconductor light-emitting device comprises a substrate; an N-type nitride semiconductor layer on the substrate; an active layer on the N-type nitride semiconductor layer; a P-type nitride semiconductor layer on the active layer; a groove in the P-type nitride semiconductor layer to form a predetermined pattern in the P-type nitride semiconductor layer; a light guide of transparent non-conductive material in the groove; and a transparent electrode layer on the P-type nitride semiconductor layer with the light guide.

15 Claims, 14 Drawing Sheets

FIG.10

| | SMALL CHIP | |
|---|---|---|
| | SEMICONDUCTOR LIGHT-EMITTING DEVICE ACCORDING TO THE RELATED ART | SEMICONDUCTOR LIGHT-EMITTING DEVICE ACCORDING TO THE PRESENT INVENTION |
| SIZE | 300X300 | 300X300 |
| APPLIED CURRENT (mA) | 20.0 | 20.0 |
| AVERAGE CURRENT DENSITY (A/cm2) | 34.87 | 34.87 |
| ACTIVE LAYER CURRENT DENSITY STD(A/cm2) | 6.42 | 5.84 |

FIG.11

| | SEMICONDUCTOR LIGHT-EMITTING DEVICE ACCORDING TO THE PRESENT INVENTION | SEMICONDUCTOR LIGHT-EMITTING DEVICE ACCORDING TO THE RELATED ART |
|---|---|---|
| SIZE | 300X300 | 300X300 |
| CURRENT DISTRIBUTION ON ITO |  |  |
| CURRENT DISTRIBUTION ON ACTIVE LAYER |  |  |

| APPLIED CURRENT | SEMICONDUCTOR LIGHT-EMITTING DEVICE ACCORDING TO THE PRESENT INVENTION | | SEMICONDUCTOR LIGHT-EMITTING DEVICE ACCORDING TO THE RELATED ART | |
|---|---|---|---|---|
| | CURRENT DENSITY | CURRENT DENSITY STD | CURRENT DENSITY | CURRENT DENSITY STD |
| 10 | 17.44 | 2.31 | 17.44 | 2.43 |
| 20 | 34.87 | 5.84 | 34.87 | 6.42 |
| 30 | 52.32 | 9.8 | 52.31 | 10.95 |
| 50 | 87.2 | 18.38 | 87.2 | 20.76 |
| 70 | 122.09 | 27.45 | 122.08 | 31.09 |
| 90 | 156.95 | 36.83 | 156.96 | 41.76 |
| 100 | 174.41 | 41.62 | 174.4 | 47.17 |

SEMICONDUCTOR LIGHT-EMITTING DEVICE HAVING GROOVE IN P-TYPE SEMICONDUCTOR LAYER AND METHOD FOR MANUFACTURING THE SAME

CROSS REFERENCE TO RELATED APPLICATIONS

This application claims the benefit of the Korean Patent Application No. 10-2009-0111996 filed on Nov. 19, 2009, which is hereby incorporated by reference as if fully set forth herein.

BACKGROUND OF THE INVENTION

1. Field of the Invention

The present invention relates to a semiconductor device, and more particularly, to a nitride semiconductor light-emitting device.

2. Discussion of the Related Art

A nitride semiconductor light-emitting device includes ultraviolet, blue, and green light-emitting regions. Especially, a GaN-based nitride semiconductor light-emitting device can be applied to an optical device of red/green light-emitting diode (LED), and an electronic device corresponding a high-speed switching or high-power device of MESFET (Metal Semiconductor Field Effect Transistor) or HEMT (Hetero Junction Field-Effect Transistor).

FIG. 1 is a cross section view illustrating a nitride semiconductor light-emitting device according to the related art.

As shown in FIG. 1, the nitride semiconductor light-emitting device 100 according to the related art includes a substrate 110, a buffer layer 120, an undoped semiconductor layer 130, an N-type nitride semiconductor layer 140, an active layer 150, a P-type nitride semiconductor layer 160, a transparent electrode layer 170, a P-type electrode 180 on the transparent electrode layer 170, and an N-type electrode 190 on the N-type nitride semiconductor layer 140 exposed by etching predetermined portions of the active layer 150 and the P-type nitride semiconductor layer 160.

In case of the nitride semiconductor light-emitting device 100 according to the related art shown in FIG. 1, since the P-type electrode 180 and the N-type electrode 190 are formed on the same plane, it is difficult to realize a uniform current distribution. Thus, as shown in FIG. 2, a current crowding phenomenon occurs in a region near to the N-type electrode 190. This current crowding phenomenon may cause various problems, for example, deterioration of the nitride semiconductor light-emitting device, the increase of forward voltage, and electrostatic discharge (ESD).

In order to overcome the aforementioned problems caused by the current crowding phenomenon, there has been proposed a method for increasing the number of electrode fingers. The increased number of electrode fingers enables the uniform current distribution. However, a light-emitting area is decreased due to the increased number of electrode fingers.

In addition, the nitride semiconductor light-emitting device according to the related art has problems such as total reflection of light, and reduction of light extraction efficiency caused by light absorption in the active layer and the electrode.

SUMMARY OF THE INVENTION

Accordingly, the present invention is directed to a semiconductor light-emitting device and a method for manufacturing the same that substantially obviates one or more problems due to limitations and disadvantages of the related art.

An advantage of the present invention is to provide a semiconductor light-emitting device capable of improving current distribution, and a method for manufacturing the same.

Another advantage of the present invention is to provide a semiconductor light-emitting device capable of improving light-extraction efficiency, and a method for manufacturing the same.

Additional advantages and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these and other advantages and in accordance with the purpose of the invention, as embodied and broadly described herein, there is provided a semiconductor light-emitting device comprising: a substrate; an N-type nitride semiconductor layer on the substrate; an active layer on the N-type nitride semiconductor layer; a P-type nitride semiconductor layer on the active layer; a groove in the P-type nitride semiconductor layer to form a predetermined pattern in the P-type nitride semiconductor layer; a light guide of transparent non-conductive material in the groove; and a transparent electrode layer on the P-type nitride semiconductor layer with the light guide.

In another aspect of the present invention, there is provided a method for manufacturing a semiconductor light-emitting device comprising: forming an N-type nitride semiconductor layer on a substrate; forming an active layer on the N-type nitride semiconductor layer; forming a P-type nitride semiconductor layer on the active layer; forming a groove in the P-type nitride semiconductor layer to form a predetermined pattern in the P-type nitride semiconductor layer; depositing a transparent non-conductive material on an entire area of the P-type nitride semiconductor layer; forming a light guide in the groove by etching the transparent non-conductive material; and forming a transparent electrode layer on the P-type nitride semiconductor layer with the light guide.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings:

FIG. 10 is a table which compares electrical properties of the semiconductor light-emitting device according to one embodiment of the present invention with electrical properties of the semiconductor light-emitting device according to the related art;

FIG. 11 illustrates current distributions of the semiconductor light-emitting device according to the present invention and the semiconductor light-emitting device according to the related art;

DETAILED DESCRIPTION OF THE INVENTION

Reference will now be made in detail to the exemplary embodiments of the present invention, examples of which are illustrated in the accompanying drawings. Wherever possible, the same reference numbers will be used throughout the drawings to refer to the same or like parts.

Hereinafter, a semiconductor light-emitting device according to the present invention and a method for manufacturing the same will be described with reference to the accompanying drawings.

Figure 1:
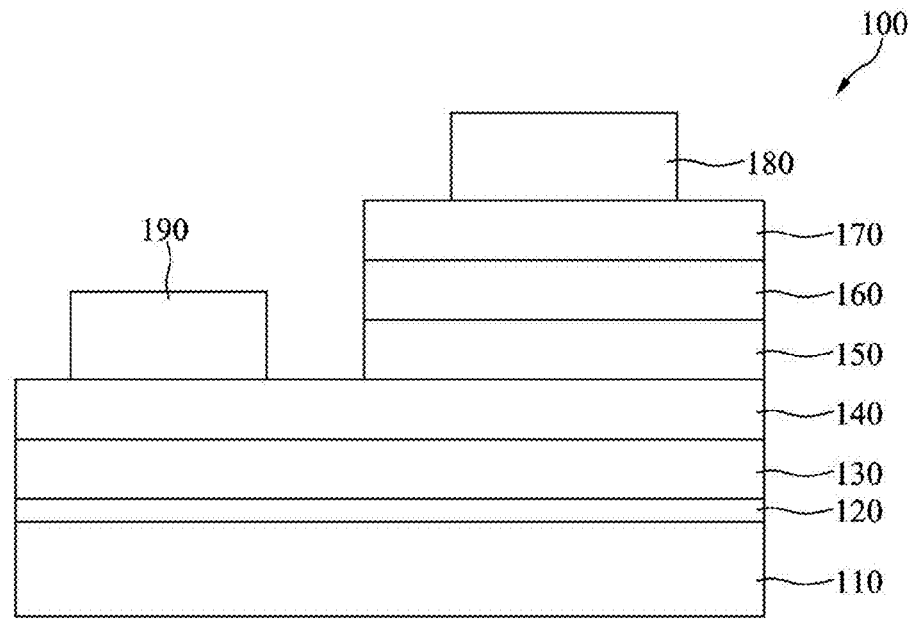
FIG. 1 is a cross section view illustrating a semiconductor light-emitting device according to the related art.
Figure 2:
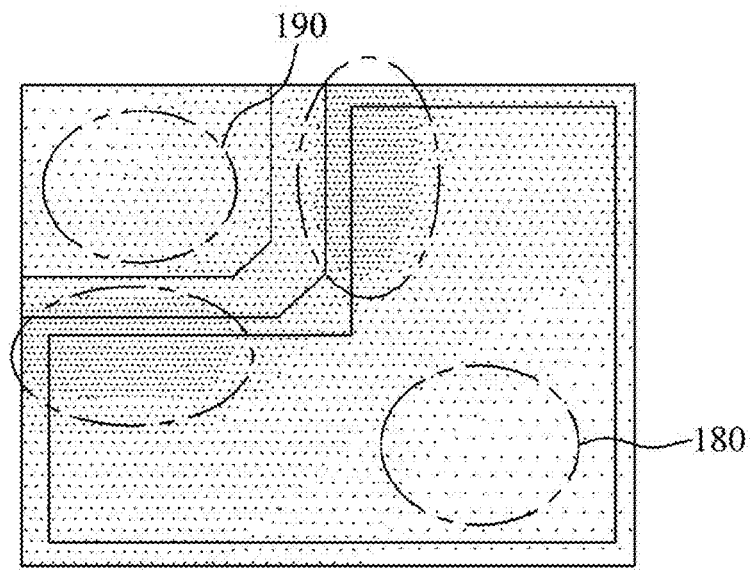
FIG. 2 illustrates a current crowding phenomenon occurring in a semiconductor light-emitting device according to the related art.
Figure 3:
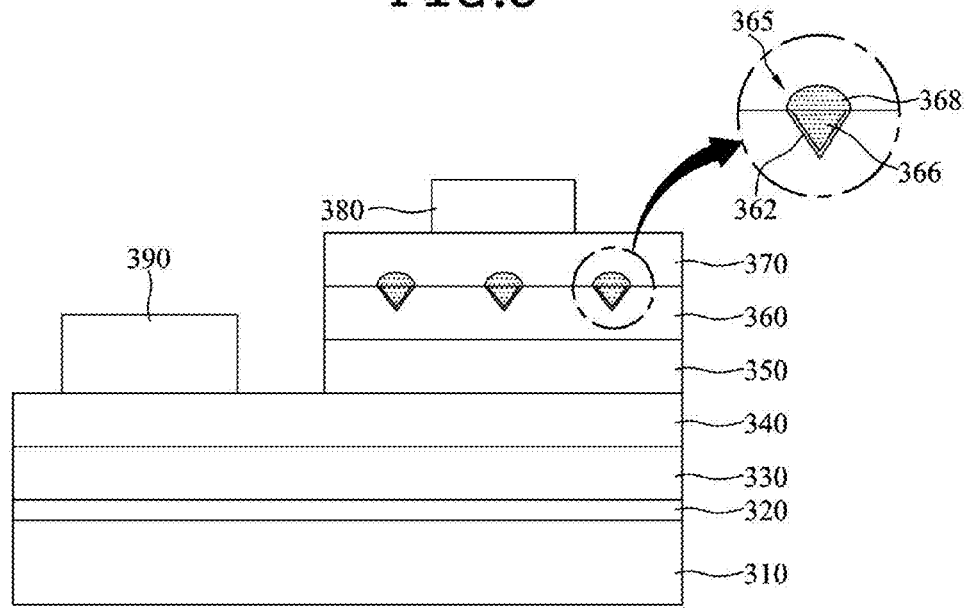
FIG. 3 is a cross section view illustrating a semiconductor light-emitting device according to one embodiment of the present invention.

FIG. 3 is a cross section view illustrating a semiconductor light-emitting device according to one embodiment of the present invention. As shown in FIG. 3, the semiconductor light-emitting device 300 according to one embodiment of the present invention includes a substrate 310, a buffer layer 320, an undoped semiconductor layer 330, an N-type nitride semiconductor layer 340, an active layer 350, a P-type nitride semiconductor layer 360, a light guide 365, a transparent electrode layer 370, a P-type electrode 380, and an N-type electrode 390.

Since there is no commercially available substrate which has the same crystal structure as crystals of nitride semiconductor material growing thereon while exhibiting a lattice matching, a sapphire substrate is primarily used for the substrate 310, in consideration of the lattice matching.

The sapphire substrate is a crystal body having Hexa-Rhombo R3c symmetry, which has the characteristics such as 13.001 Å lattice constant in the c-axis direction; 4.765 Å distance between lattices in the a-axis direction; and C(0001) plane, A(1120) plane, and R(1102) plane in the direction of the orientation plane of the sapphire. On the C plane of the sapphire substrate, the nitride semiconductor material is easily grown, and is also stable at a high temperature. In this respect, the sapphire substrate is primarily used as the substrate for blue or green light-emitting device.

In addition to the aforementioned sapphire substrate, the substrate 310 may be selectively formed of GaN, SiC, ZnO, GaP, GaAs, or a conductive material.

The buffer layer 320 is provided to decrease a difference of the lattice constant between the substrate 310 and the N-type nitride semiconductor layer 320. The buffer layer 320 is formed on the substrate 310. The buffer layer 320 may be selectively formed in AlInN structure, InGaN/GaN super lattice structure, InGaN/GaN stacking structure, or AlInGaN/InGaN/GaN stacking structure.

The undoped semiconductor layer 330 is formed on the buffer layer 320, wherein the undoped semiconductor layer 330 may be formed of a GaN-based material. For example, the undoped semiconductor layer 330 may be formed on the buffer layer 320 by supplying $NH_3$ and tri-metal gallium (TMGa) at 1500° C. temperature.

The aforementioned embodiment of the present invention discloses that both the buffer layer 320 and undoped layer 330 are formed on the substrate 310. However, semiconductor light-emitting device according to a modified embodiment of the present invention may include any one of the buffer layer 320 and undoped semiconductor layer 330, or may include neither the buffer layer 320 nor undoped semiconductor layer 330. For convenience of explanation, supposing that the following embodiments to be described include both the buffer layer 320 and undoped layer 330. However, the following embodiments to be described can be readily applied to semiconductor light-emitting device including any one of the buffer layer 320 and undoped semiconductor layer 330, and semiconductor light-emitting device including neither the buffer layer 320 nor undoped layer 330.

The N-type nitride semiconductor layer 340 is formed on the undoped semiconductor layer 330. Typically, the nitride semiconductor layer 340 is formed of GaN, AlGaN, InGaN, AlN, or AlInGaN. In this case, a dopant used for doping of the N-type nitride semiconductor layer 340 may be Si, Ge, Sn, Se, or Te.

The N-type nitride semiconductor layer 340 may be formed by growing the aforementioned semiconductor material on the substrate 310 by MOCVD (Metal Organic Chemical Vapor Deposition), MBE (Molecular Beam Epitaxy), or HVPE (Hydride Vapor Phase Epitaxy).

The active layer 350 is provided to emit the light, which is obtained by forming a multiple quantum well (MQW) under such circumstances that a well is formed of InGaN layer, and a barrier layer is formed of (Al)GaN layer. A blue light-emitting diode uses a multiple quantum well structure of InGaN/GaN; and an ultraviolet light-emitting diode uses a multiple quantum well structure of GaN/AlGaN, InAlGaN/InAlGaN, or InGaN/AlGaN. On improvement of efficiency in the active layer 350, a light wavelength can be controlled by changing a component of In or Al; or an internal quantum efficiency can be improved by changing a depth of the well in the active layer 350, the number of active layers 350, and the thickness of active layer 350.

In the same method as that of the N-type nitride semiconductor layer 340, the active layer 350 may be formed by MOCVD (Metal Organic Chemical Vapor Deposition), MBE (Molecular Beam Epitaxy), or HVPE (Hydride Vapor Phase Epitaxy).

The P-type nitride semiconductor layer 360 is formed on the active layer 350, wherein the P-type nitride semiconductor layer 360 may be formed of a typical nitride-based semiconductor material such as GaN, AlGaN, InGaN, AlN, or AlInGaN. In this case, a dopant used for doping of the P-type nitride semiconductor layer 360 may be Mg, Zn, or Be.

The P-type nitride semiconductor layer 360 may be formed by growing the aforementioned nitride-based semiconductor material on the active layer 350 by MOCVD (Metal Organic Chemical Vapor Deposition), MBE (Molecular Beam Epitaxy), or HVPE (Hydride Vapor Phase Epitaxy).

As shown in FIG. 3, a groove 362 is formed in the P-type nitride semiconductor layer 360 of the semiconductor light-emitting device 300 according to the present invention. This is because the groove 362 in the P-type nitride semiconductor layer 360 prevents light transmitted from the active layer 350 from being reflected totally. In the semiconductor light-emitting device according to the present invention, the groove 362 may have "V-shaped" cross section so as to efficiently prevent the total reflection of light.

Figure 4A:
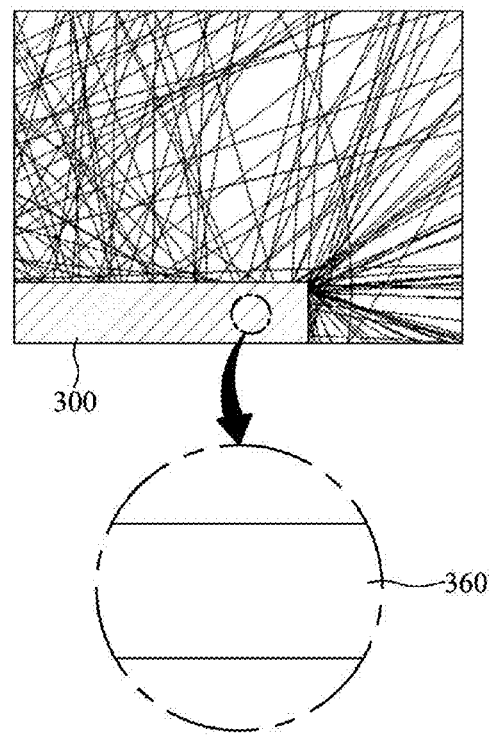
FIG. 4A illustrates a simulation result of light path in a P-type nitride semiconductor layer without grooves in the semiconductor light-emitting device of FIG. 3.
Figure 4B:
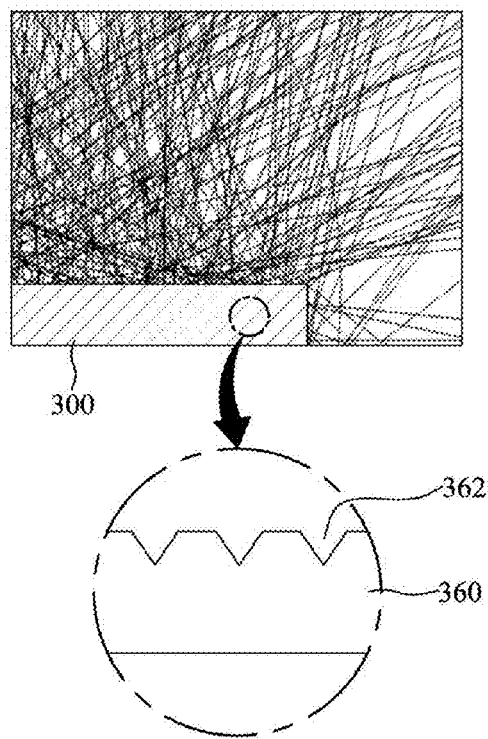
FIG. 4B illustrates a simulation result of light path in a P-type nitride semiconductor layer with grooves in the semiconductor light-emitting device of FIG. 3.

In more detail, if the groove is not formed in the P-type nitride semiconductor layer 360, the light transmitted from the active layer 350 might be totally reflected as shown in FIG. 4A, thereby causing the reduction of light extraction efficiency. However, according to the present invention, the V-shaped groove 362 is formed in the P-type nitride semiconductor layer 360, as shown in FIG. 4B, so that it is possible to prevent the light from being totally reflected, to thereby improve light extraction efficiency.

The aforementioned embodiment of the present invention discloses the V-shaped groove 362. However, the groove 362 may have any structure capable of preventing the total reflection of light. For example, a modified embodiment of the present invention may include the groove 362 whose cross section is a polygon or semicircle shape.

Figure 5:
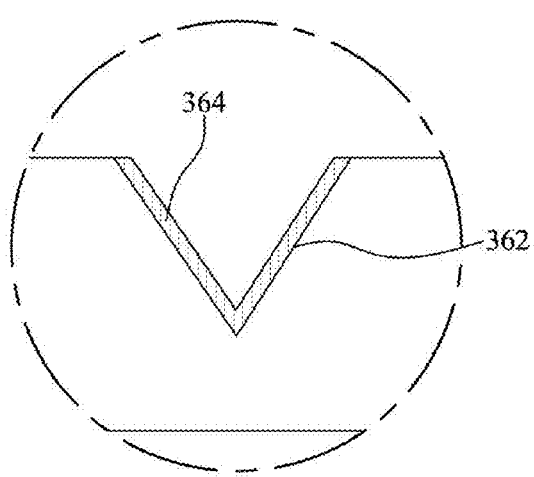
FIG. 5 is a cross section view illustrating a reflective layer in an inner surface of the groove shown in FIG. 3.

In order to enhance the efficiency of preventing the total reflection of light, as shown in FIG. 5, a reflective layer 364 may be additionally formed on an inner surface of the groove 362. At this time, the reflective layer 364 may be formed of a material selected from a group consisting of Al, Ti, Au, Ag, Ni, Sn, Cu, Cr, and their mixtures.

Figure 6A:
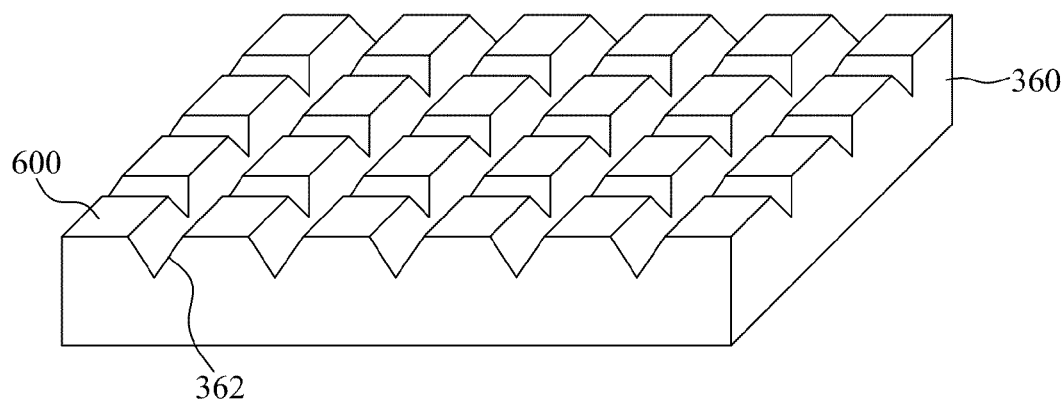
FIGS. 6A and 6B illustrate various patterns in the P-type nitride semiconductor layer shown in FIG. 3.
Figure 6B:
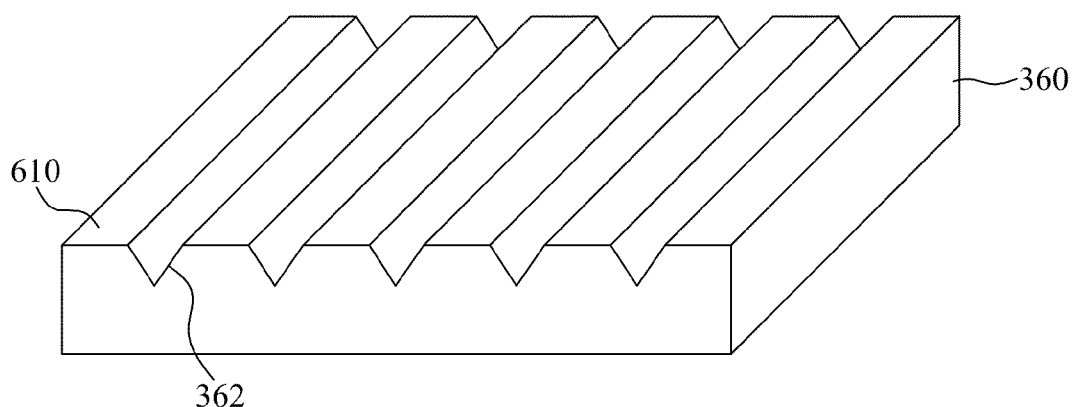

At this time, the groves 362 may be formed in the P-type nitride semiconductor layer 360 so that the P-type nitride semiconductor layer 360 may have the predetermined pattern. The predetermined pattern may be formed in such a way that plural polygons are arranged repeatedly under the circumstance that the grooves 362 are interposed among boundaries of the neighboring polygons. For example, the predetermined pattern may be a lattice type obtained by repeatedly arranging plural quads 600 under the circumstance that the grooves 362 are interposed among boundaries of the neighboring quads, as shown in FIG. 6A. In another way, as shown in FIG. 6B, the predetermined pattern may be a stripe type obtained by repeatedly arranging plural quad 610 under the circumstance that the grooves 362 are interposed among boundaries of the neighboring quads. In addition, the predetermined pattern may be form that plural hexagons are repeatedly arranged under the circumstance that the grooves 362 are interposed among boundaries of the neighboring hexagons; or plural circles are repeatedly arranged under the circumstance that the grooves 362 are interposed among boundaries of the neighboring circles.

Referring once again to FIG. 3, the light guide 365 is formed on the groove 362 of the P-type nitride semiconductor layer 360. According to one embodiment of the present invention, the light guide 365 may be formed of a transparent non-conductive material capable of transmitting light and blocking a current flow, for example, $Si_xO_y$-based oxide material.

As the light guide 365 is formed of the non-conductive material capable of blocking the current flow, the light guide 365 accomplishes a function of blocking the current flowing-in through the P-type electrode 380, to thereby distribute the current. According as the light guide 365 is selectively formed in any one part of inner and upper parts of the P-type nitride semiconductor layer 360, the current flowing-in through the P-type electrode 380 is uniformly distributed to all sides by the light guide 365, to thereby prevent a current crowding phenomenon.

As shown in an enlarged area A of FIG. 3, the light guide 365 includes a first light guide 366 and a second light guide 368, wherein the first light guide 366 is formed inside the groove 362, and the second light guide 368 is formed on the first light guide 366. At this time, the second light guide 368 is provided to enhance the light dispersion, to thereby result in improved light extraction efficiency. The second light guide 368 is thinner than the transparent electrode layer 370. For example, the second light guide 368 is formed at 0.1 μm thickness.

Figure 7A:
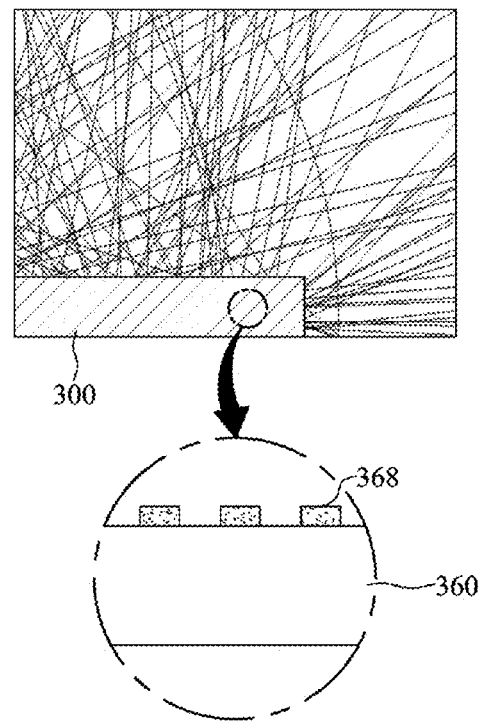
FIG. 7A illustrates a simulation result of light path in a second light guide having a quad-shaped cross section.
Figure 7B:
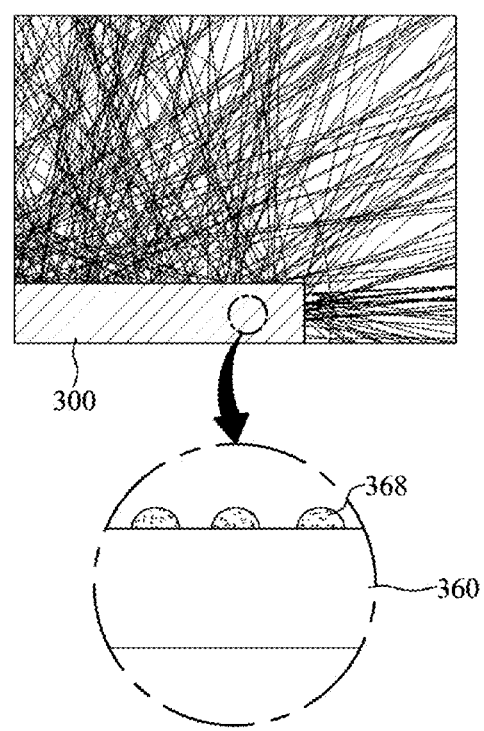
FIG. 7B illustrates a simulation result of light path in a second light guide having a semicircle-shaped cross section.

In order to accomplish the more improved light dispersion, the second light guide 368 may have "semicircle-shaped" cross section. In more detail, the light extraction efficiency in the semicircle-shaped second light guide 368 shown in FIG. 7B is higher than the light extraction efficiency in the quad-shaped second light guide 368 shown in FIG. 7A, owing to the more improved light dispersion.

In addition, the second light guide 368 may have a polygon-shaped cross section.

Figure 8:
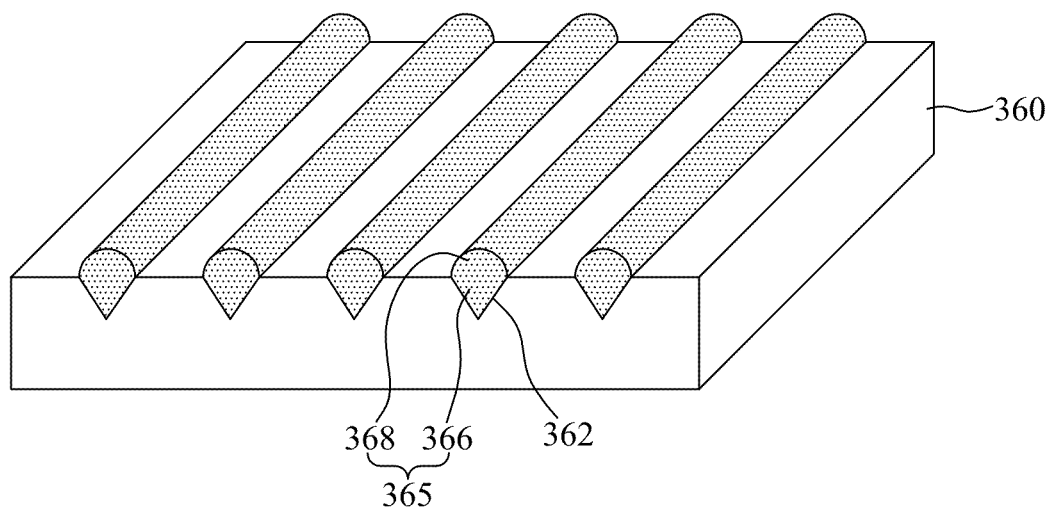
FIG. 8 illustrates a light guide formed in the pattern of FIG. 6B.

FIG. 8 shows that the aforementioned first and second light guides 366 and 368 are formed on the grooves 362 according to the predetermined pattern shown in FIG. 6B.

Preferably, the aforementioned light guide 365 covers less than 50% of the P-type nitride semiconductor layer 360.

The aforementioned embodiment of the present invention discloses that the light guide 365 includes both the first and second light guides 366 and 368. In a modified embodiment of the present invention, the light guide 365 may include any one of the first and second light guides 366 and 368.

As mentioned above, the light guide 365 of the transparent non-conductive material is formed between the P-type nitride semiconductor layer 360 and the transparent electrode layer 370, so that it is possible to prevent the current crowding phenomenon, and also it is possible to prevent the total reflection of light by the groove 362 in the P-type nitride semiconductor layer 360.

Referring once again to FIG. 3, the transparent electrode layer 370 is formed on the P-type nitride semiconductor layer 360 with the light guide 365. Preferably, the transparent electrode layer 370 is formed of a material which is capable of reducing a contact resistance to the P-type nitride semiconductor layer 360 having a relatively-high energy band gap, and also having good light-transmitting property so as to upwardly transmit the light generated in the active layer 350 therethrough.

Generally, the transparent electrode layer 370 is formed in a dual-layered structure of Ni/Au. Preferably, the transparent electrode layer 370 is formed of a predetermined material such as Indium-Tin-Oxide (ITO), Cadmium-Tin-Oxide (CTO), or Titanium-Tungsten-Nitride (TiWN). The aforementioned predetermined material for the transparent electrode layer 370 can realize good light-transmitting property, but its contact resistance is relatively high.

The transparent electrode layer 370 may be formed by a deposition method such as CVD (Chemical Vapor Deposition) or E-beam evaporator, or may be formed by sputtering. At this time, a heat treatment of about 400° C. to 900° C. is applied to improve ohmic contact property.

As mentioned above, the transparent electrode layer 370 may be thicker than the second light guide 368. For example, the transparent electrode layer 370 may be formed at 0.2 μm thickness.

The P-type electrode 380 is formed on the transparent electrode layer 370. The P-type electrode 380 may be formed of aurum (Ar) or an alloy containing aurum (Au) by a deposition method such as CVD (Chemical Vapor Deposition) or E-beam evaporator, or by sputtering.

The N-type electrode 390 is formed on the mesa-etched N-type nitride semiconductor layer 340, wherein the N-type electrode 390 may be formed in a single-layered structure or multi-layered structure using a material selected from a material group of Ti, Cr, Al, Cu, and Au. The N-type electrode 390 may be formed on the N-type nitride semiconductor layer 340 by a deposition method such as CVD (Chemical Vapor Deposition) or E-beam evaporator, or by sputtering.

A method for manufacturing the semiconductor light-emitting device according to the present invention will be described with reference to FIG. 9. FIGS. 9A to 9L are cross section views illustrating a method for manufacturing the semiconductor light-emitting device according to one embodiment of the present invention.

Figure 9A:
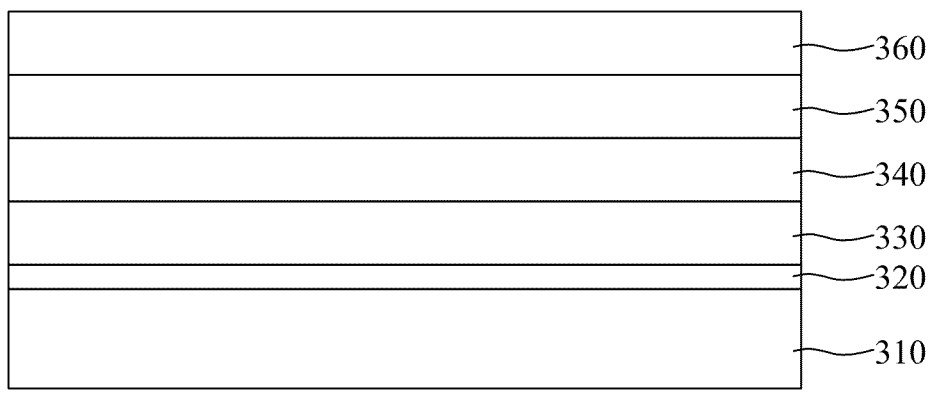
FIGS. 9A to 9L are cross section views illustrating a method for manufacturing the semiconductor light-emitting device according to one embodiment of the present invention.

First, as shown in FIG. 9A, the buffer layer 320, the undoped semiconductor layer 330, the N-type nitride semiconductor layer 340, the active layer 350, and the P-type nitride semiconductor layer 360 are sequentially formed on the substrate 310. At this time, it is possible to form at least any one of the buffer layer 320 and the undoped semiconductor layer 330, or to form neither the buffer layer 320 nor undoped semiconductor layer 330.

A method for forming the substrate 310, the buffer layer 320, the undoped semiconductor layer 330, the N-type nitride semiconductor layer 340, the active layer 350, and the P-type nitride semiconductor layer 360 has been explained with reference to FIG. 3, whereby a detailed explanation thereof will be omitted.

Figure 9B:
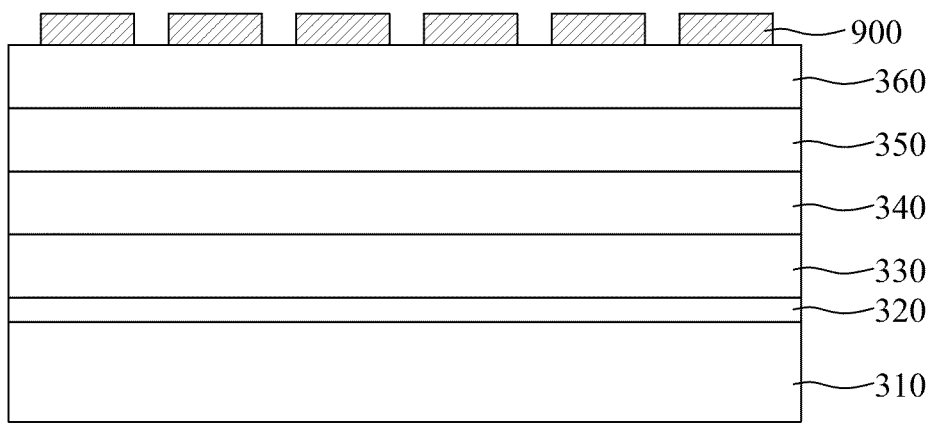

As shown in FIG. 9B, a mask pattern 900 is formed of photoresist so as to form the groove 362 in the P-type nitride semiconductor layer 360, to thereby form the predetermined pattern in the P-type nitride semiconductor layer 350.

Figure 9C:
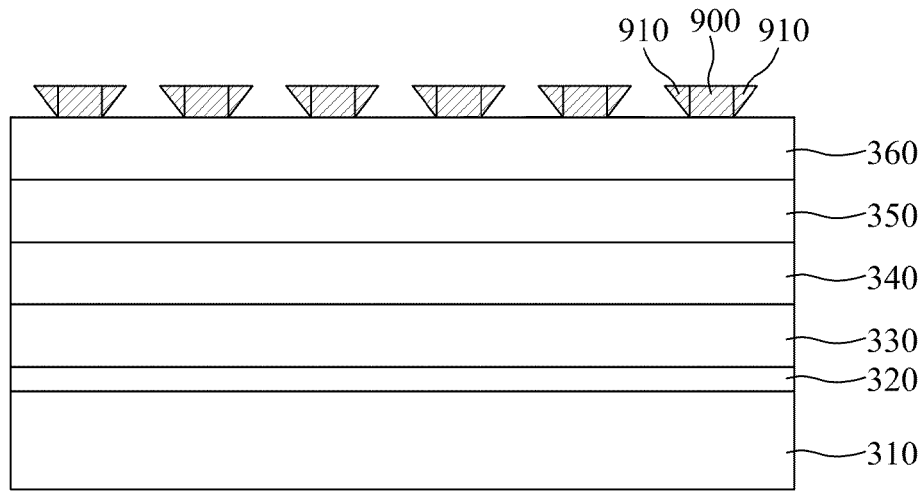

According to one embodiment of the present invention, the V-shaped groove 362 is formed to efficiently prevent the total reflection of light. For this, as shown in FIG. 9C, an additional mask pattern 910 may be formed at a side of the mask pattern 800 through an over development.

Figure 9D:
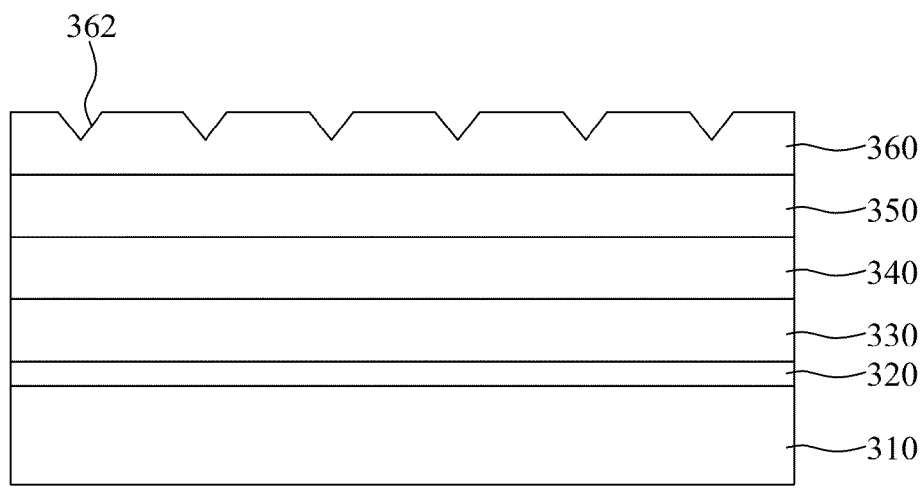

Then, as shown in FIG. 9D, after the V-shaped groove 362 is formed to obtain the predetermined pattern on the P-type nitride semiconductor layer 350 by wet-etching or plasma-etching, the mask patterns 900 and 910 are removed. In this case, the groove 362 may have 0.1 μm depth, and 1 μm height. The reason why the groove 362 is formed in the P-type nitride semiconductor layer 360 is to prevent the total reflection of light transmitted from the active layer 350.

The aforementioned embodiment of the present invention discloses the V-shaped groove 362. However, the groove 362 may have any structure capable of preventing the total reflection of light. For example, in the modified embodiment of the present invention, polygon or semicircle shape cross section groove may be formed.

At this time, the groves 362 may be formed in the P-type nitride semiconductor layer 360 so that the P-type nitride semiconductor layer 360 may have the predetermined pattern. The predetermined pattern may be formed in such a way that plural polygons are arranged repeatedly under the circumstance that the grooves 362 are interposed among boundaries of the neighboring polygons.

For example, the predetermined pattern may be the lattice type obtained by repeatedly arranging plural quads 600 under the circumstance that the grooves 362 are interposed among boundaries of the neighboring quads, as shown in FIG. 6A. In another way, as shown in FIG. 6B, the predetermined pattern may be the stripe type obtained by repeatedly arranging plural quad 610 under the circumstance that the grooves 362 are interposed among boundaries of the neighboring quads. In addition, the predetermined pattern may be formed in such a way that plural hexagons are repeatedly arranged under the circumstance that the grooves 362 are interposed among boundaries of the neighboring hexagons; or plural circles are repeatedly arranged under the circumstance that the grooves 362 are interposed among boundaries of the neighboring circles.

Figure 9E:
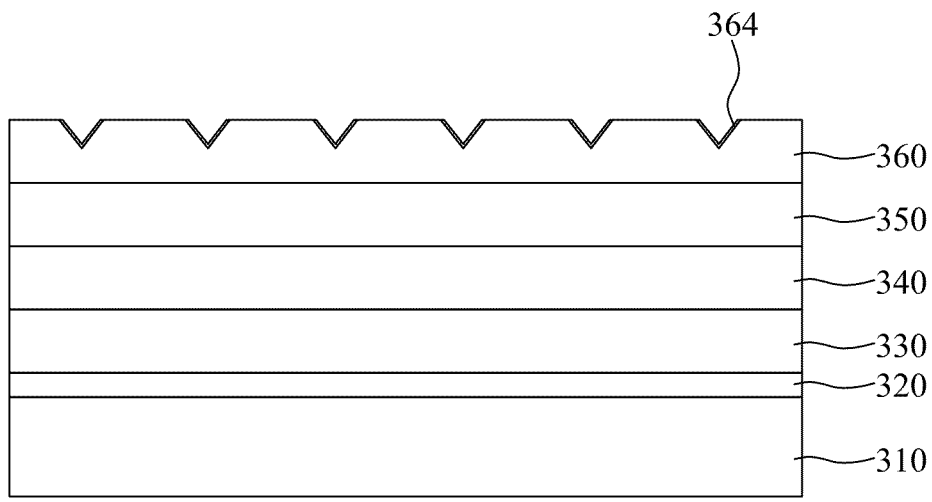

Then, as shown in FIG. 9E, the reflective layer 364 is additionally formed on the inner surface of the groove 362. The reflective layer 364 on the inner surface of the groove 362 enables to improve the efficiency of preventing the total reflection of light. At this time, the reflective layer 364 may be formed of a material selected from a group consisting of Al, Ti, Au, Ag, Ni, Sn, Cu, Cr, and their mixtures.

The aforementioned process for forming the reflective layer 364 may be selectively carried out since it is optionally provided for the more improvement in efficiency of preventing the total reflection of light.

Figure 9F:
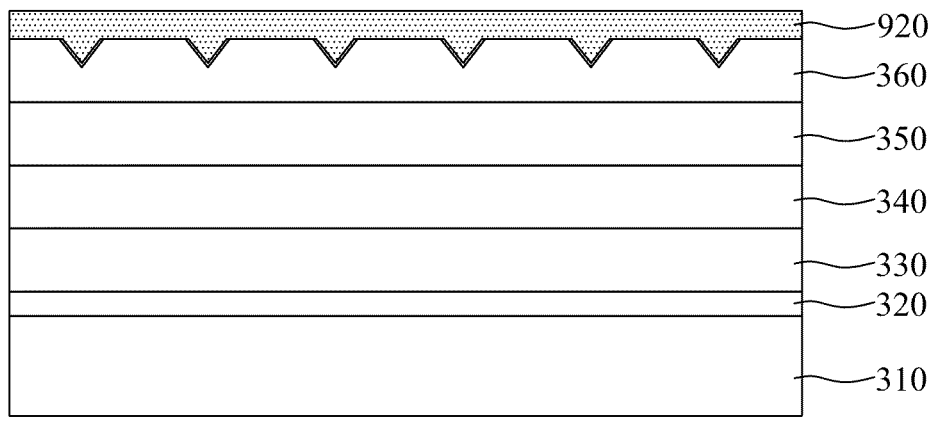
Figure 9G:
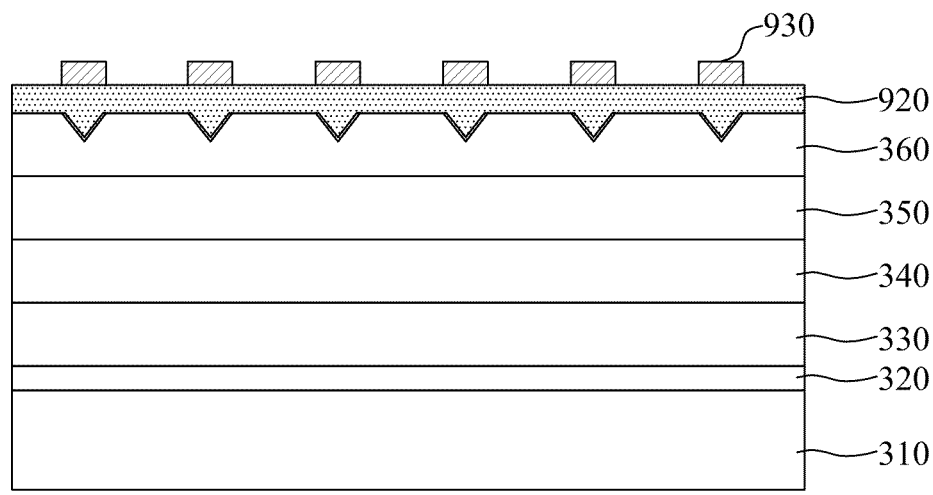

As shown in FIG. 9F, a transparent non-conductive material layer 920 is deposited on the P-type nitride semiconductor layer 360. Then, as shown in FIG. 9G, a mask pattern 930 of photoresist is formed on the transparent non-conductive material layer 920. At this time, the non-conductive material layer may be formed of $Si_xO_y$-based oxide material.

Figure 9H:
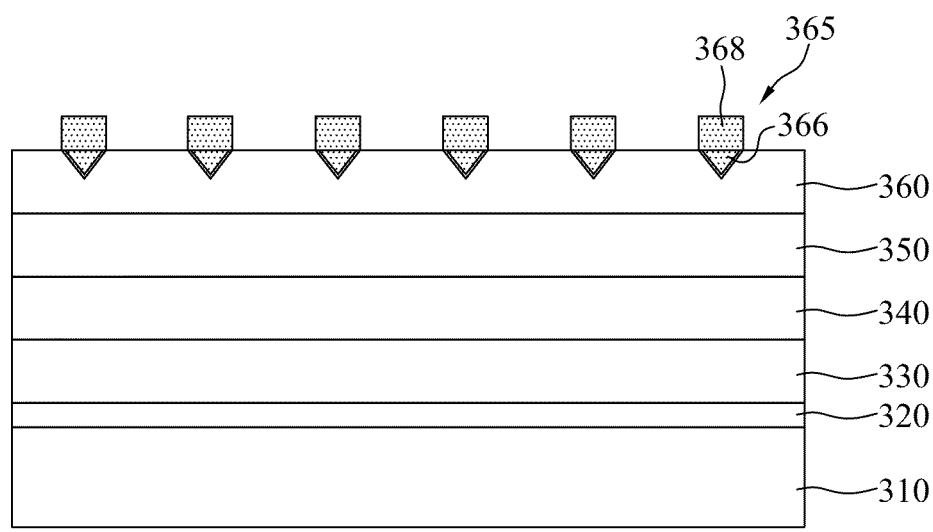

Then, as shown in FIG. 9H, after the light guide 365 is formed by etching the transparent non-conductive material layer 920, the mask pattern 930 is removed. At this time, the light guide 365 includes the first light guide 366 and the second light guide 368, wherein the first light guide 366 is formed inside the groove 362, and the second light guide 368 is formed on the first light guide 366. The reason why the light guide 365 is formed of the non-conductive material is to disperse the current by blocking the current flowing-in through the P-type electrode 380.

Preferably, the second light guide 368 is thinner than the transparent electrode layer 370. For example, the second light guide 368 may be formed at 0.1 μm thickness.

Figure 9I:
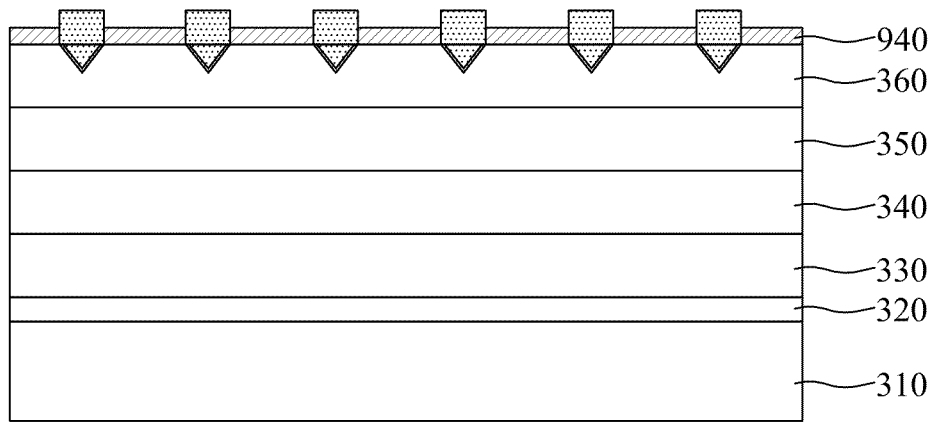
Figure 9J:
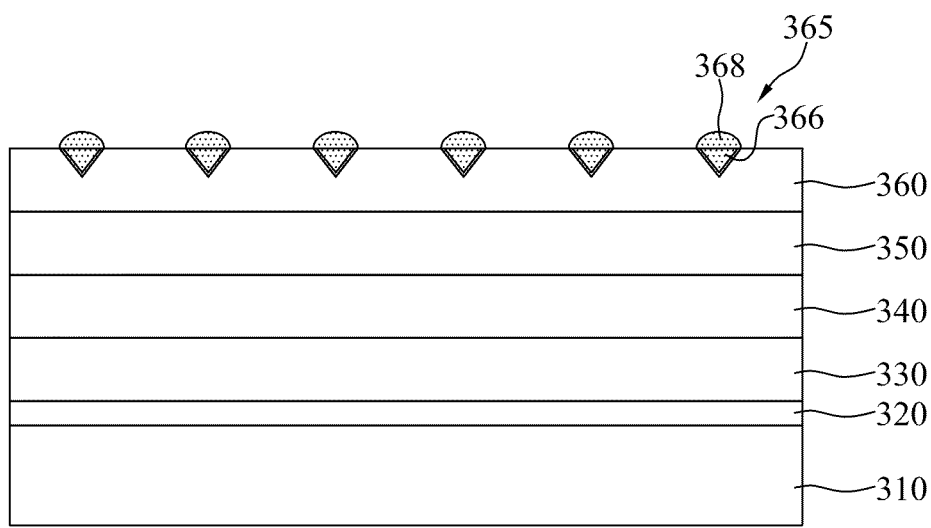

FIG. 9H discloses that the second light guide 366 has the quad-shaped cross section. In the modified embodiment of the present invention, the second light guide 368 may have the semicircle-shaped cross section to enhance the light dispersion. For this, as shown in FIG. 9I, a protective layer such as photoresist is coated onto the P-type nitride semiconductor layer 360 with the light guide 365, wherein the protective layer is thinner than the light guide 365. Then, as shown in FIG. 9J, the protective layer is removed after the plasma-etching, to thereby form the semicircle-shaped second light guide 368.

FIG. 9I discloses that the second light guide 368 has the semicircle-shaped cross section. In the modified embodiment of the present invention, the second light guide 368 may have the polygon-shaped cross section.

In the semiconductor light-emitting device according to the present invention, the current flowing-in through the P-type electrode 380 is uniformly dispersed to all sides to avoid the first light guide 366 and the second light guide 368, to thereby prevent the current crowding phenomenon.

The aforementioned embodiment of the present invention discloses that the light guide 365 includes both the first light guide 366 and the second light guide 368. However, the modified embodiment of the present invention may disclose that the light guide 365 includes any one of the first light guide 366 and the second light guide 368. Thus, some of the aforementioned processes shown in FIGS. 9G to 9I might be omitted.

Figure 9K:
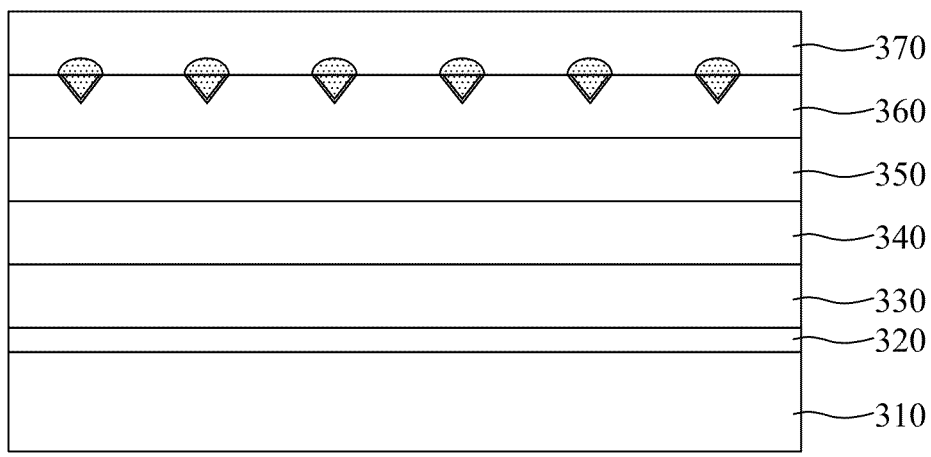

Then, as shown in FIG. 9K, the transparent electrode layer 370 is coated onto an entire surface of the P-type nitride semiconductor layer 360 with the light guide 365. At this time, the transparent electrode layer 370 is thicker than the aforementioned second light guide 368. For example, the transparent electrode layer 370 may be formed at 0.2 μm thickness.

Figure 9L:
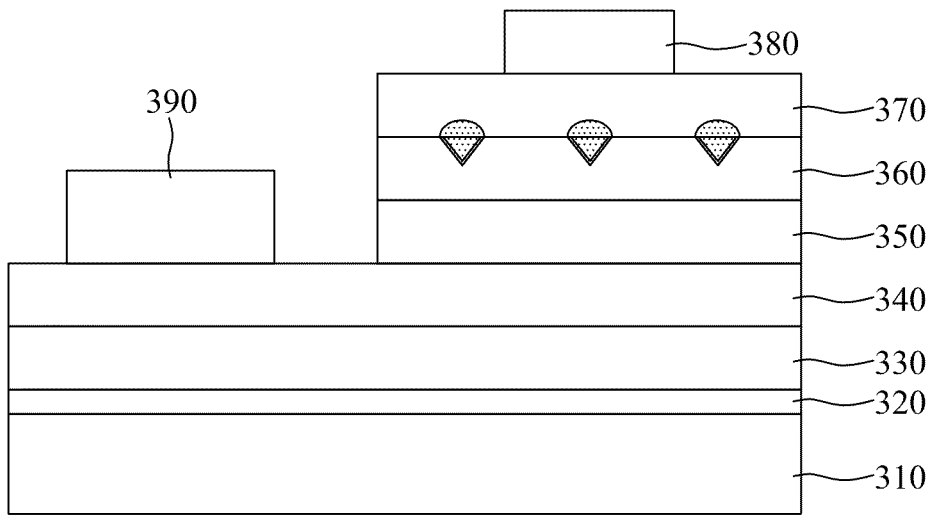

As shown in FIG. 9L, after the mesa-etching is applied until the N-type nitride semiconductor layer 340 for forming the N-type electrode 390, the P-type electrode 380 is formed on the transparent electrode layer 370, and the N-type electrode 390 is formed on the mesa-etched N-type nitride semiconductor layer 340.

Although not shown, for improving reliability of the semiconductor light-emitting device, an insulating layer using an oxide such as $SiO_2$ is formed on the entire surface of the semiconductor light-emitting device; the substrate is thinned by lapping and polishing processes; and then the semiconductor light-emitting device is divided into individual chips by a scribing process using laser or diamond.

FIG. 10 is a table which compares electrical properties of the semiconductor light-emitting device according to one embodiment of the present invention with electrical properties of the semiconductor light-emitting device according to the related art. As shown in FIG. 10, a current density STD (Standard Deviation) in the active layer of the semiconductor light-emitting device according to one embodiment of the present invention can be improved more than 10% as compared to that in the active layer of the semiconductor light-emitting device according to the related art.

FIG. 11 illustrates current distributions of the semiconductor light-emitting device according to the present invention and the semiconductor light-emitting device according to the related art. As shown in FIG. 11, the current distribution in the active layer of the semiconductor light-emitting device according to the present invention is greatly improved as compared to the current distribution in the active layer of the semiconductor light-emitting device according to the related art.

Figures 12A, 12B:
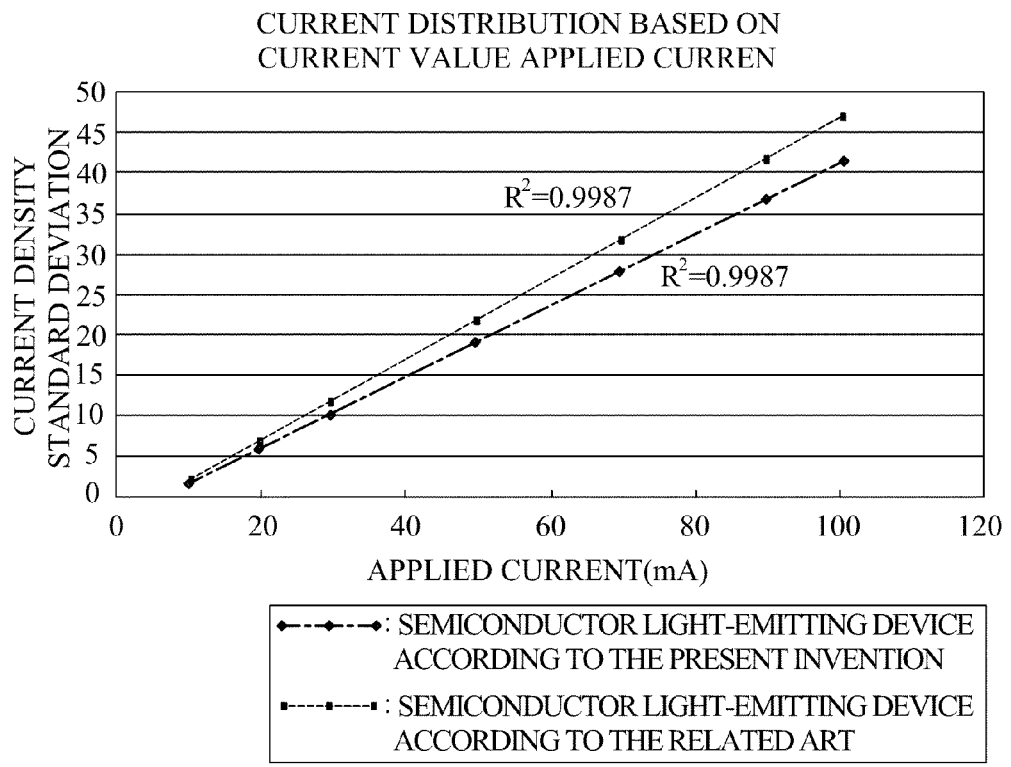
FIG. 12A is a table which shows the current distributions of the semiconductor light-emitting device according to the present invention and the semiconductor light-emitting device according to the related art.
FIG. 12B is a graph showing the current distributions of the semiconductor light-emitting device according to the present invention and the semiconductor light-emitting device according to the related art.

FIG. 12A is a table which shows the current distributions of the semiconductor light-emitting device according to the present invention and the semiconductor light-emitting device according to the related art. FIG. 12B is a graph showing the current distributions of the semiconductor light-emitting device according to the present invention and the semiconductor light-emitting device according to the related art. As shown in FIG. 12, when applying the same current value, the current distribution of the semiconductor light-emitting device according to the present invention is better than the current distribution of the semiconductor light-emitting device according to the related art.

According to the present invention, the light guide 365 of the transparent non-conductive material is formed in any one part of inner and upper parts of the P-type nitride semiconductor layer 360, whereby the light guide 365 blocks the current. Thus, the current distribution is improved in the active layer 350.

In addition to the improved current distribution by the light guide 365, the present invention can prevent the deterioration of the semiconductor light-emitting device, accomplish the decrease of forward voltage, and also overcome the problem of electrostatic discharge (ESD).

Also, the groove 362 is formed in the P-type nitride semiconductor layer 360, to thereby prevent the total reflection of light. Also, the semicircle-shaped or polygon-shaped light guide 365 is formed on the P-type nitride semiconductor layer 360, so that it is possible to increase the light dispersion, and thereby to improve the light extraction efficiency.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A semiconductor light-emitting device comprising:
a substrate;
an N-type nitride semiconductor layer on the substrate;
an active layer on the N-type nitride semiconductor layer;
a P-type nitride semiconductor layer on the active layer;
a groove in the P-type nitride semiconductor layer to form a predetermined pattern in the P-type nitride semiconductor layer;
a light guide of transparent non-conductive material on the groove; and
a transparent electrode layer on the P-type nitride semiconductor layer with the light guide,
wherein the light guide comprises a first light guide inside the groove and a second light guide on the first light guide.

2. The semiconductor light-emitting device according to claim 1, wherein the predetermined pattern is formed by repeatedly arranging plural polygons or circles and by interposing the grooves among boundaries of the neighboring polygons or neighboring circles.

3. The semiconductor light-emitting device according to claim 1, wherein the groove has a V-shaped, semicircle-shaped, or polygon-shaped cross section.

4. The semiconductor light-emitting device according to claim 3, further comprising a reflective layer between the surface of groove and the light guide, the reflective layer of a material selected from a group consisting of Al, Ti, Au, Ag, Ni, Sn, Cu, Cr, and their mixtures.

5. The semiconductor light-emitting device according to claim 1, wherein the transparent non-conductive material is a $Si_xO_y$-based oxide material.

6. The semiconductor light-emitting device according to claim 1, wherein the second light guide is thinner than the transparent electrode layer, and the second light guide has a semicircle-shaped or polygon-shaped cross section.

7. The semiconductor light-emitting device according to claim 1, further comprising a reflective layer between the surface of groove and the light guide.

8. The semiconductor light-emitting device according to claim 7, wherein the reflective layer is formed of a material selected from a group consisting of Al, Ti, Au, Ag, Ni, Sn, Cu, Cr, and their mixtures.

9. The semiconductor light-emitting device according to claim 1, wherein the second light guide is thinner than the transparent electrode layer.

10. The semiconductor light-emitting device according to claim 1, wherein the second light guide has a semicircle-shaped or polygon-shaped cross section.

11. A method for manufacturing a semiconductor light-emitting device comprising:

forming an N-type nitride semiconductor layer on a substrate;

forming an active layer on the N-type nitride semiconductor layer;

forming a P-type nitride semiconductor layer on the active layer;

forming a groove in the P-type nitride semiconductor layer to form a predetermined pattern in the P-type nitride semiconductor layer;

depositing a transparent non-conductive material on an entire area of the P-type nitride semiconductor layer;

forming a light guide on the groove by etching the transparent non-conductive material; and forming a transparent electrode layer on the P-type nitride semiconductor layer with the light guide, wherein forming the light guide comprises forming a first light guide inside the groove; and forming a second light guide on the first light guide.

12. The method according to claim 11, wherein forming the groove comprises:

obtaining a predetermined pattern by repeatedly arranging plural polygons or circles under the circumstance that the grooves are interposed among boundaries of the neighboring polygons or neighboring circles, wherein the groove has a V-shaped, semicircle-shaped, or polygon-shaped cross section.

13. The method according to claim 11, wherein the second light guide is thinner than the transparent electrode layer, and the second light guide has a semicircle-shaped or polygon-shaped cross section.

14. The method according to claim 11, further comprising:

forming a reflective layer on the surface of the groove, the reflective layer of a material selected from a group consisting of Al, Ti, Au, Ag, Ni, Sn, Cu, Cr, and their mixtures, between steps of forming the groove and forming the light guide.

15. A semiconductor light-emitting device comprising:

a substrate;

an N-type nitride semiconductor layer on the substrate;

an active layer on the N-type nitride semiconductor layer;

a P-type nitride semiconductor layer on the active layer;

a groove in the P-type nitride semiconductor layer to form a predetermined pattern in the P-type nitride semiconductor layer;

a light guide of transparent non-conductive material on the groove;

a transparent electrode layer on the P-type nitride semiconductor layer with the light guide; and a reflective layer between the surface of groove and the light guide.

* * * * *